(12) United States Patent
Bien et al.

(10) Patent No.: US 9,166,578 B2
(45) Date of Patent: Oct. 20, 2015

(54) FINE PULSE GENERATOR AND METHOD FOR GENERATING FINE PULSE

(71) Applicant: UNIST ACADEMY-INDUSTRY RESEARCH CORPORATION, Ulsan (KR)

(72) Inventors: Franklin Bien, Ulsan (KR); Kyung Min Na, Bucheon-si (KR); Yun Ho Choi, Ulsan (KR); Sai Kiran Oruganti, Ulsan (KR)

(73) Assignee: UNIST ACADEMY-INDUSTRY RESEARCH CORPORATION, Ulsan (KR)

( * ) Notice: Subject to any disclaimer, the term of this patent is extended or adjusted under 35 U.S.C. 154(b) by 0 days.

(21) Appl. No.: 14/300,348

(22) Filed: Jun. 10, 2014

(65) Prior Publication Data

US 2014/0361822 A1    Dec. 11, 2014

(30) Foreign Application Priority Data

Jun. 11, 2013 (KR) .................. 10-2013-0066786

(51) Int. Cl.
*H03K 5/133* (2014.01)
*H03K 5/13* (2014.01)
*H03K 5/00* (2006.01)

(52) U.S. Cl.
CPC ...... *H03K 5/133* (2013.01); *H03K 2005/00052* (2013.01)

(58) Field of Classification Search
CPC .................. H03K 5/133–5/135; H03K 3/012; H03K 5/14; G06F 1/04–1/10
USPC ......................................................... 327/299
See application file for complete search history.

(56) References Cited

U.S. PATENT DOCUMENTS 5,600,274 A *    2/1997   Houston .................. 327/262
2012/0139598 A1*  6/2012  Kim et al. .................. 327/173

FOREIGN PATENT DOCUMENTS

| KR | 1020090028112 | 3/2009 |
| KR | 1020120061398 | 6/2012 |
| KR | 1020120071929 | 7/2012 |
| KR | 10-1258209 | 4/2013 |

* cited by examiner

*Primary Examiner* — Lincoln Donovan
*Assistant Examiner* — David Mattison
(74) *Attorney, Agent, or Firm* — Lex IP Meister, PLLC

(57) ABSTRACT

There are provided a pulse generator capable of securing a maximum transfer rate of an IR-UWB signal, while maintaining low power consumption characteristics of an all-digital scheme, and a method for generating a fine pulse. A bandwidth of a fine pulse is determined by adjusting a difference in delay time between two adjacent pulses and a pulse is generated by selecting only one of a rising edge and a falling edge of an input pulse, and thus there is no need to remove an unnecessary batch of pulses afterwards and a transfer rate is enhanced.

13 Claims, 6 Drawing Sheets

FINE PULSE GENERATOR AND METHOD FOR GENERATING FINE PULSE

CROSS-REFERENCE TO RELATED APPLICATION

This application claims priority to and the benefit of Korean Patent Application No. 10-2013-0066786 filed in the Korean Intellectual Property Office on Jun. 11, 2013, the entire contents of which are incorporated herein by reference.

BACKGROUND OF THE INVENTION (a) Field of the Invention

The present invention relates to an all-digital fine pulse generator and a method for generating a fine pulse.

(b) Description of the Related Art

Impulse-radio ultra-wideband (IR-UWB) communication systems, consuming a small amount of power, have come to prominence to lead short-range sensor networks. Unlike existing narrowband communication schemes using a super-heterodyne system, IR-UWB communication systems employ a direct conversion scheme in a baseband, eliminating the need for transceivers to additionally perform a frequency transition, thus supporting non-coherent communication. In addition, IR-UWB communication systems do not require a local oscillator, a mixer, a phase locked loop, or the like, thereby reducing equipment size, and ultra-low power consumption thereof allows long-term use with a limited battery lifespan, and thus, IR-UWB communication systems may be easily applied to a wireless personal area network (WPAN), a wireless body area network (WBAN), or the like.

To achieve low power consumption, IR-UWB communication systems use an all-digital pulse generator. The all-digital pulse generator consumes only energy according to a capacitance component and a sub-threshold leakage current, advantageously achieving low power consumption, compared to analog circuits in which a constant current flows all the time.

In order to implement an all-digital pulse generator, in the related art, fine pulses are generated from both a rising edge and a falling edge of an input signal, and one of the two pulses is removed. However, with this method, a transfer rate is limited in a process of removing a pulse.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a pulse generator capable of securing a maximum transfer rate of an IR-UWB signal while maintaining low power consumption characteristics of an all-digital scheme, and a method for generating a fine pulse.

An exemplary embodiment of the present invention provides a method for providing a fine pulse by an all-digital pulse generator. The method for generating a fine pulse includes: generating a plurality of pulses delayed at predetermined time intervals; generating reverse pulses respectively corresponding to a plurality of pulses; and generating a plurality of fine pulses using the reverse pulses.

The generating of a plurality of reverse pulses includes: dividing one of the plurality of pulses into first and second pulses and inputting the first and second pulses having different phases and different delay times to a logic gate; and generating a reverse pulse corresponding to the one pulse using a first delay pulse with respect to the first pulse and a second delay pulse with respect to the second pulse in the logic gate.

After passing through 2k inverters (k=1, 2, ..., n), the first pulse may be changed to the first delay pulse, after passing through 2k−1 inverters (k=1, 2, ..., n), the second pulse may be changed to the second delay pulse, and the first delay pulse and the second delay pulse may be input to a not-AND (NAND) gate, respectively.

After passing through 2k inverters (k=1, 2, ..., n), the first pulse may be changed to the first delay pulse, after passing through 2k−1 inverters (k=1, 2, ..., n), the second pulse may be changed to the second delay pulse, and the first delay pulse and the second delay pulse may be input to an OR gate, respectively.

A reverse duration of the revere pulse may be equal to a difference between a delay time of the first delay pulse and a delay time of the second delay pulse.

The generating of a plurality of fine pulses may include generating fine pulses using a difference in reverse time between a first reverse pulse corresponding to one pulse and a second reverse pulse corresponding to a pulse adjacent to the one pulse.

The difference in reverse time between the first reverse pulse and the second reverse pulse may be equal to a difference in delay time between the one pulse and the adjacent pulse, and a pulse duration of a fine pulse may be equal to the difference in reverse time.

The method may further include combining fine pulses to generate a batch of fine pulses.

Another embodiment of the present invention provides an all-digital pulse generator for generating a fine pulse. The all-digital pulse generator may include: an input pulse delay unit configured to generate a plurality of pulses delayed at predetermined time intervals; and a fine pulse output unit configured to generate reverse pulses respectively corresponding to a plurality of pulses to generate a plurality of fine pulses.

The fine pulse output unit may include a reverse pulse generating unit dividing one of the plurality of pulses into first and second pulses, generating a first delay pulse and a second delay pulse having different phases and different delay times, and inputting the first delay pulse and the second delay pulse to a logic gate to generate a reverse pulse corresponding to the one pulse.

The reverse pulse generating unit may include: a first delay unit including 2k inverters (k=1, 2, ..., n) configured to receive a first pulse and output a first delay pulse; a second delay unit including 2k−1 inverters (k=1, 2, ..., n) configured to receive a second pulse and output a second delay pulse; and a not-AND (NAND) gate or an OR gate configured to receive the first delay pulse and the second delay pulse and generate a reverse pulse corresponding to one pulse.

The fine pulse output unit may generate a fine pulse using a difference in reverse time between a first reverse pulse corresponding to one pulse and a second reverse pulse corresponding to a pulse adjacent to the one pulse.

The difference in reverse time between the first reverse pulse and the second reverse pulse may be equal to a difference in delay time between the first pulse and the second pulse, and a pulse duration of the fine pulses may be equal to the difference in reverse time.

The all-digital pulse generator may further include a pulse synthesizing unit configured to combine fine pulses to generate a batch of fine pulses.

The all-digital pulse generator may further include an additional selecting unit configured to further add a fine pulse to the batch of fine pulses.

According to an embodiment of the present disclosure, a bandwidth of a fine pulse may be determined by adjusting a difference in delay time (t_delay2) between two adjacent pulses.

Also, since a pulse is generated by selecting only one of a rising edge and a falling edge of an input pulse, there is no need to remove an unnecessary batch of pulses afterwards and a transfer rate may be enhanced.

DETAILED DESCRIPTION OF THE EMBODIMENTS

Figure 1:
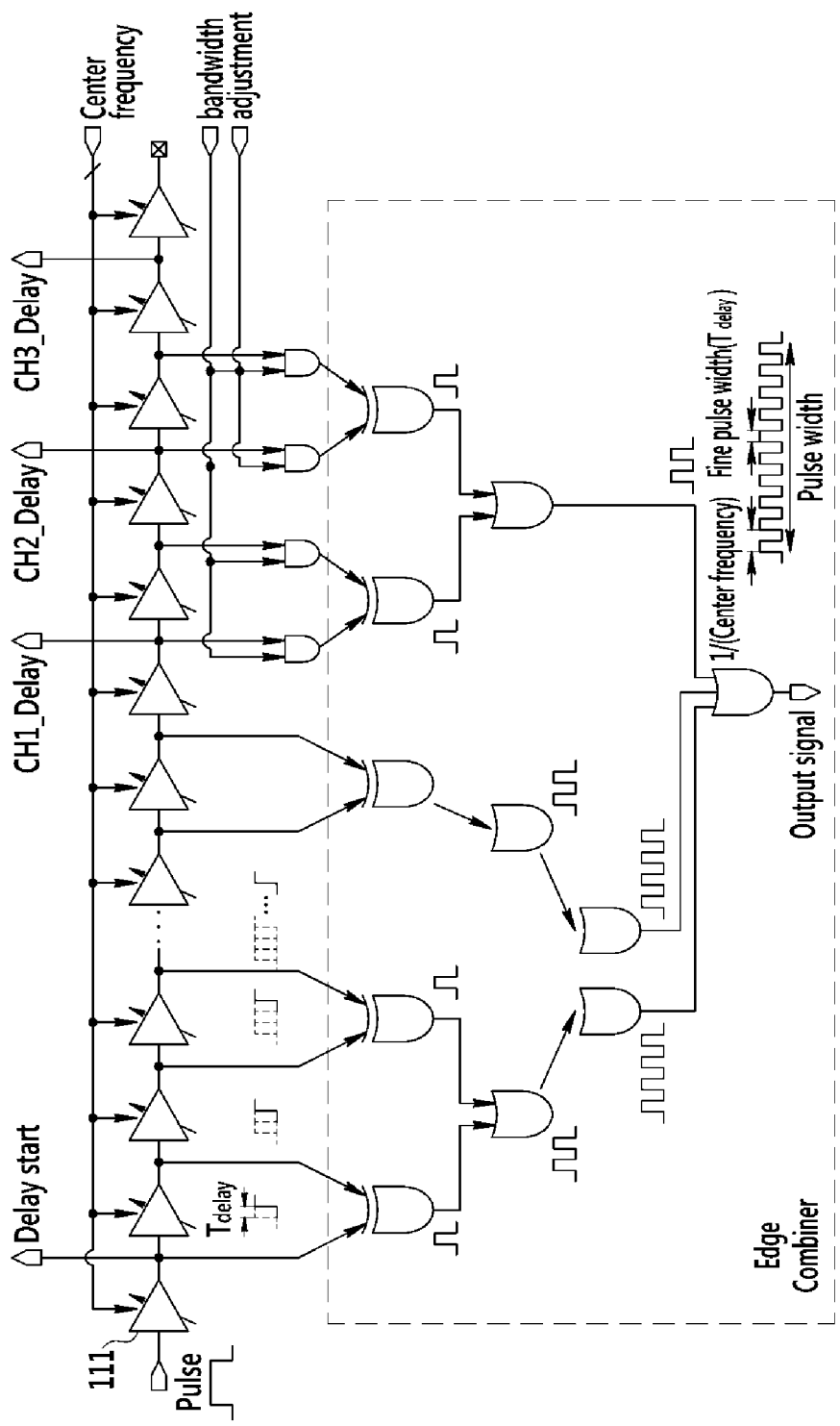
FIG. 1 is a view illustrating a related art all-digital pulse generator.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is a view illustrating a related art all-digital pulse generator.

Referring to FIG. 1, when a pulse is input to the all-digital pulse generator, the pulse may be delayed during a period of time in which the pulse passes through a buffer in a plurality of delay cells connected in series. The pulse before passing through the buffer and the pulse which has passed through the buffer so as to be delayed are paired, and as the pair of pulses pass through an exclusive-OR (XOR) gate, fine pulses are generated. The generated fine pulses are added in an OR gate of the all-digital pulse generator, and finally, a batch of fine pulses is output.

However, since a fine pulse is generated even through a falling edge of an input pulse, two batches of fine pulses may be generated from a single input pulse. In this case, however, an unnecessary batch among the two batches of fine pulses may need to be removed through a self-referencing scheme or the like, and a transfer rate of an IR-UWB signal is lowered while fine pulses are removed.

Figure 2:
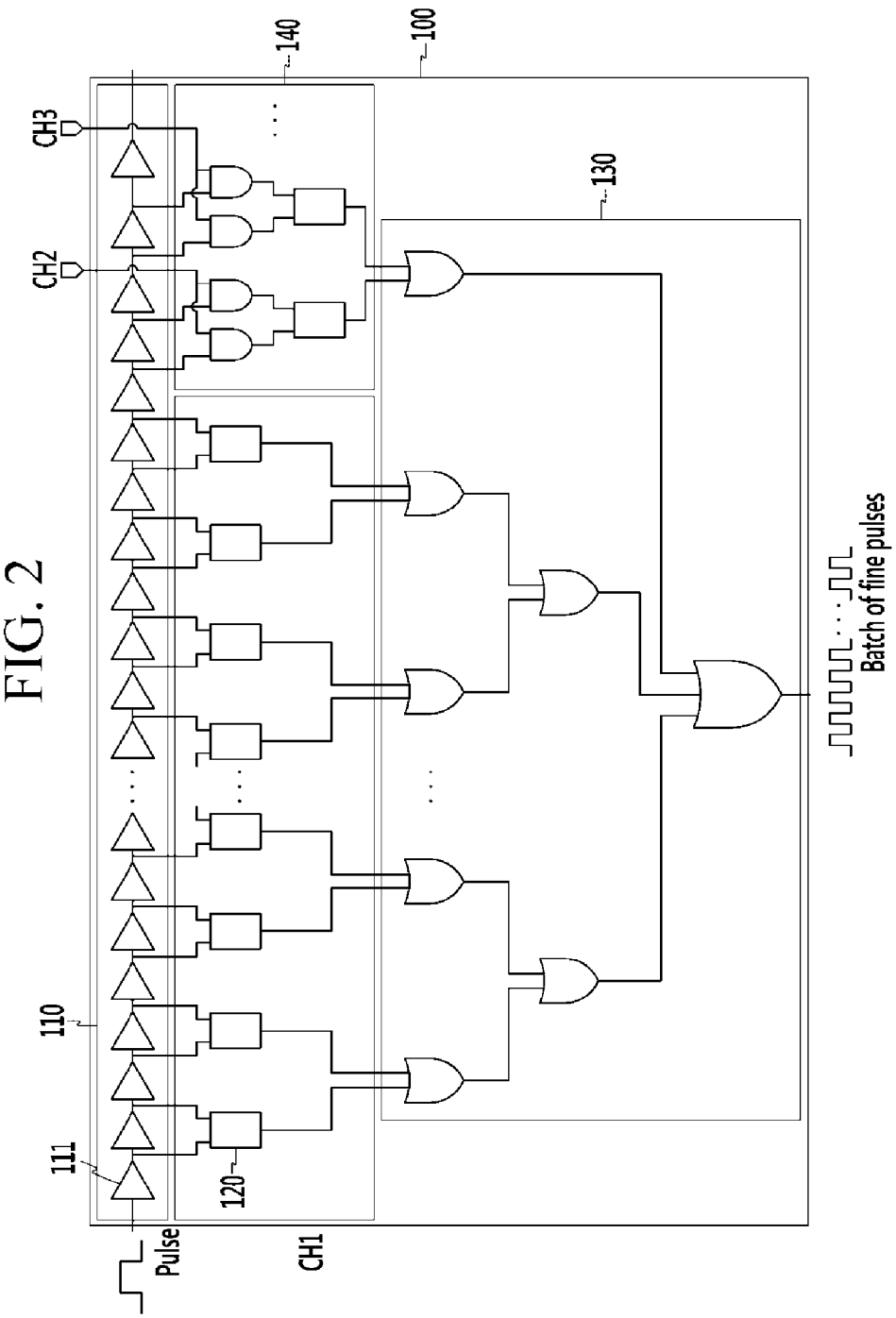
FIG. 2 is a view illustrating an all-digital pulse generator according to an embodiment of the present disclosure.

FIG. 2 is a view illustrating an all-digital pulse generator according to an embodiment of the present disclosure.

Referring to FIG. 2, an all-digital pulse generator 100 includes an input pulse delay unit 110, a fine pulse output unit 120, a pulse synthesizing unit 130, and an additional selecting unit 140.

The input pulse delay unit 110 delays a pulse input to the all-digital pulse generator 100. According to an embodiment of the present disclosure, a pulse input to the all-digital pulse generator 100 may be delayed in time when input to the fine pulse output unit 120 through a plurality of buffers 111. The input pulse delay unit 110 may include a plurality of buffers 111 according to the number of fine pulses intended to be generated.

Although not shown in FIG. 2, a center frequency of a batch of fine pulses may be changed by adjusting a delay time in each buffer 111 of the input pulse delay unit 110. The all-digital pulse generator 100 according to an embodiment of the present disclosure may use a low frequency ultra-wideband (UWB), and may adjust a center frequency of a batch of fine pulses by changing a channel (for example, a center frequency of CH1—3.5 GHz, a center frequency of CH2—4.0 GHz, or a center frequency of CH3—4.5 GHz).

The fine pulse output unit 120 receives two of delayed pulses from the input pulse delay unit 110 and detects a difference in delay time between the delayed two pulses to output a fine pulse. The fine pulse output from the fine pulse output unit 120 is generated only by a rising edge or a falling edge of an input pulse, and thus there is no need to remove an unnecessary batch of fine pulses. The number of fine pulse output units 120 may be determined according to the number of fine pulses intended to be generated.

The pulse synthesizing unit 130 combines fine pulses output from the fine pulse output unit 120 to generate a batch of fine pulses. Here, the number of combined fine pulses may be determined according to the number of buffers 111 of the input pulse delay unit 110 and the number of the fine pulse output units 120.

The additional selecting unit 140 may be used to flexibly adjust the number of fine pulses included in a batch of fine pulses. Referring to FIG. 2, initial setting of the all-digital pulse generator may be determined by a fine pulse output unit included in CH1, and a user who wants to add the number of fine pulses may add the number of fine pulses through CH2, CH3, or the like, included in the additional selecting unit 140. When a fine pulse is added, a bandwidth of a batch of fine pulses is increased.

Hereinafter, an operation of the fine pulse output unit will be described in detail with reference to FIGS. 3 through 5.

Figure 3:
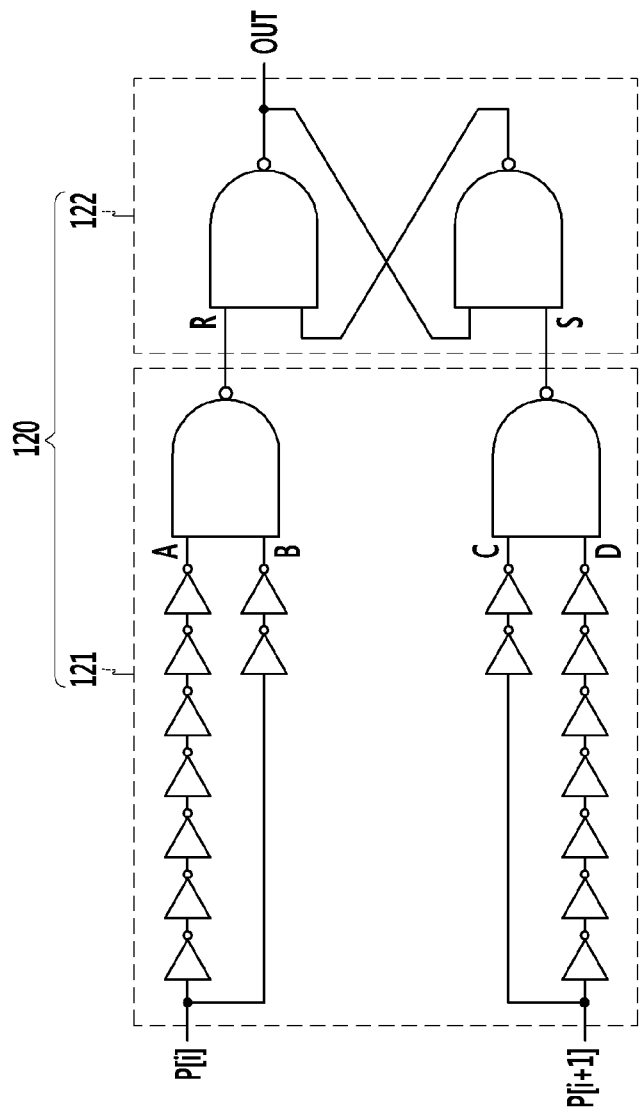
FIG. 3 is a view illustrating a fine pulse output unit according to an embodiment of the present disclosure.
Figure 4:
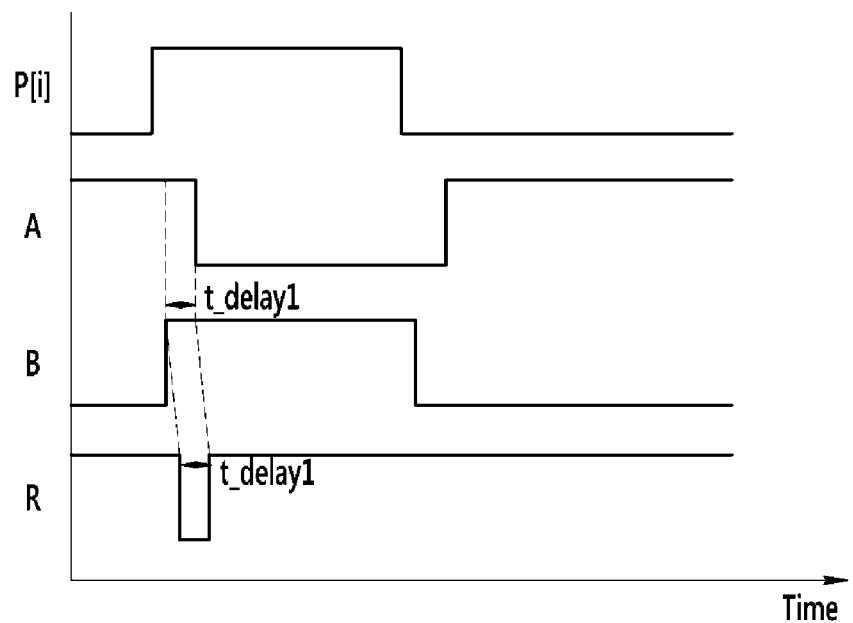
FIG. 4 is a view illustrating waveforms that pass through a reverse pulse generating unit according to an embodiment of the present disclosure.
Figure 5:
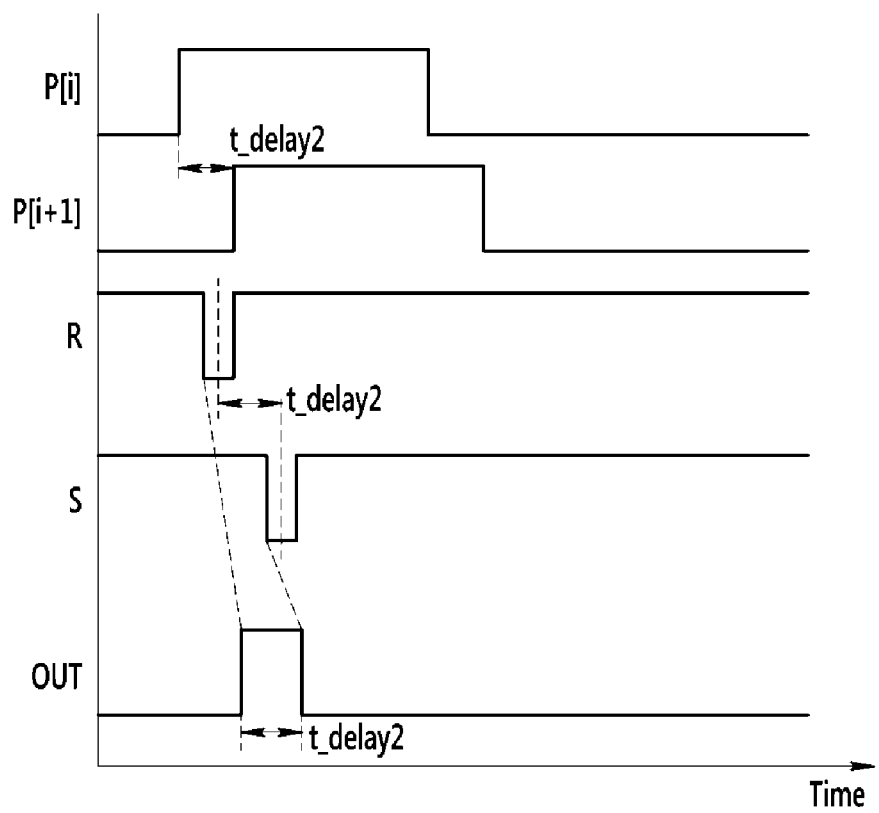
FIG. 5 is a view illustrating waveforms that pass through a fine pulse generating unit according to an embodiment of the present disclosure.

FIG. 3 is a view illustrating a fine pulse output unit according to an embodiment of the present disclosure, FIG. 4 is a view illustrating waveforms that pass through a reverse pulse generating unit according to an embodiment of the present disclosure, and FIG. 5 is a view illustrating waveforms that pass through a fine pulse generating unit according to an embodiment of the present disclosure.

Referring to FIG. 3, the fine pulse output unit 120 includes a reverse pulse generating unit 121 and a fine pulse generating unit 122.

First, the reverse pulse generating unit 121 converts a delayed pulse into a reverse pulse. In FIG. 3, the delayed pulse is reversed using an inverter and a NAND (not-AND) gate.

An operation of the reverse pulse generating unit 121 will be described. A pulse P[i] input to the fine pulse output unit 120 may pass through a plurality of inverters so as to be input to the NAND gate. Here, a pulse which has passed through an odd number of inverters may be input to one terminal of the NAND gate, and a pulse which has passed through an even number of inverters may be input to the other terminal of the NAND gate.

Referring to FIG. 4, a difference in delay time (t_delay1) corresponding to a difference between the numbers of inverters is induced between the pulse which has passed through the odd number of inverters and the pulse which has passed through the even number of inverters, and the difference in delay time (t_delay1) is a width (t_delay1) of the reverse pulse.

In an embodiment of the present disclosure, a pulse to be input to the terminal A of the NAND gate of the reverse pulse generating unit 121 is supposed to pass through seven inverters, and a pulse to be input to a terminal B of the NAND gate is supposed to pass through two inverters. Thus, the pulse input to the terminal A is more delayed by a time required for the pulse to pass through five inverters than the pulse input to the terminal B, so as to be input to the NAND gate.

That is, in an embodiment of the present disclosure, the pulse which has passed through the odd number of inverters is more delayed than the pulse which has passed through the even number of inverters (the odd number of inverters>the even number of inverters), and in order to detect a rising edge of each pulse, the NAND gate is used. Here, in order to detect a falling edge of each pulse to generate a reverse pulse, an OR gate rather than the NAND gate may be used.

Also, in a case in which the pulse which has passed through the odd number of inverters is first input to the gate, relative to the pulse which has passed through the even number of inverters (odd number of inverters<even number of inverters), the OR gate may be used to detect a rising edge and the NAND gate may be used to detect a falling edge.

In other words, according to an embodiment of the present disclosure, a reverse pulse may be generated by detecting only one of a rising edge and a falling edge by using the NAND gate or the OR gate.

Thereafter, the pulses respectively input to the NAND gate at the difference in delay time (t_delay1) is converted into a reverse pulse having a reverse duration corresponding to the difference in delay time (t_delay1). In FIG. 5, waveforms input to two terminals R and S of the fine pulse generating unit 122 correspond to the reverse pulse output from the reverse pulse generating unit 121.

Referring to FIG. 5, the two reverse pulses input to the fine pulse generating unit 122 are also input with a time difference. The difference in input time is due to a time delay (t_delay2) in the input pulse delay unit 110. The two adjacent pulses output from the input pulse delay unit 110 have a time difference (t_delay2) by a time required for passing through one buffer, respectively, and the difference is delivered to the fine pulse generating unit 122.

According to an embodiment of the present disclosure, the fine pulse generating unit 122 includes a pair of NAND gates, and an output from each NAND gate is fed back to one of inputs of other NAND gates. A truth table of the pair of NAND gates included in the fine pulse generating unit 122 is shown in Table 1.

TABLE 1

| S | R | Action |
|---|---|--------|
| 0 | 0 | Restricted combination |
| 0 | 1 | OUT = 0 |
| 1 | 0 | OUT = 1 |
| 1 | 1 | No Change |

Hereinafter, a process of generating a fine pulse by the fine pulse generating unit 122 will be described with reference to Table 1 and FIG. 5.

A reverse pulse input to the input terminal R of the fine pulse generating unit 122 is generated from an input pulse P[i], and a reverse pulse input to the input terminal S is generated from an input pulse P[i+1]. That is, a time difference between the reverse pulse input to the input terminal S and the reverse pulse input to the input terminal R is equal to the difference in delay time (t_delay2) between the input pulses P[i] and P[i+1].

Until the reverse pulses are input to the input terminals R and S of the fine pulse generating unit 122, inputs to the two input terminals are 1, and thus an output terminal of the fine pulse generating unit 122 maintains 0.

Here, a case in which two inputs to the fine pulse generating unit 122 are both 0 is limited, and thus, a fine pulse may be generated using a reverse pulse not causing the case in which two inputs to the fine pulse generating unit 122 are both 0.

Thereafter, the moment the reverse pulse is input to the input terminal R, 0 is input to the input terminal R and 1 is input to the input terminal S, and thus 1 is output from the output terminal.

Thereafter, even when the input to the input terminal R is maintained as 0 during t_delay1 and changed to 1, the output terminal of the fine pulse generating unit 122 does not change the output thereof, and thus 1 is still maintained in the output terminal.

Finally, when a reverse pulse is input to the input terminal S so 0 is input to the input terminal S, the output terminal of the fine pulse generating unit 122 outputs 0, and thereafter, even through the input to the input terminal S is recovered to 1, the output terminal continues to output 0.

As described above, when a fine pulse is generated according to the embodiment of the present disclosure, the difference (t_delay2) in delay time between two adjacent pulses output from the input pulse delay unit 110 is a duration of the fine pulse as is, and thus, a bandwidth of the fine pulse may be determined by adjusting the delay time (t_delay2) by the input pulse delay unit 110.

Also, since a pulse may be generated by selecting only one of a rising edge and a falling edge of an input pulse, there is no need to remove an unnecessary batch of pulses afterwards and a transfer rate may be enhanced.

Figure 6:
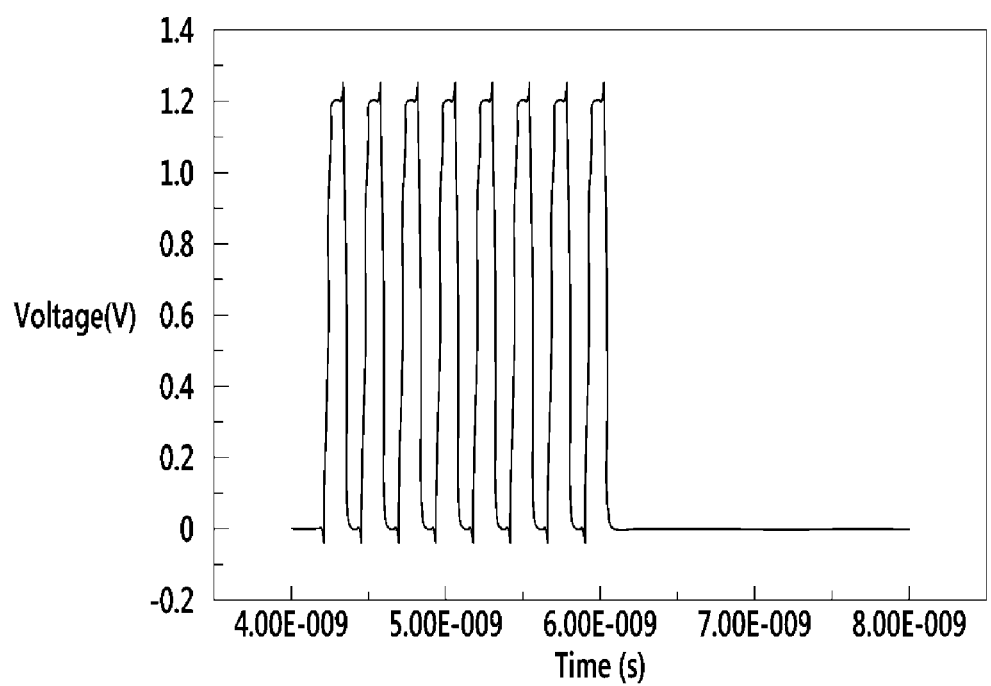
FIG. 6 is a graph illustrating a batch of fine pulses according to an embodiment of the present disclosure.

FIG. 6 is a graph illustrating a batch of fine pulses according to an embodiment of the present disclosure.

Referring to FIG. 6, the pulse synthesizing unit combines fine pulses output from a plurality of fine pulse output units 120 to generate a batch of fine pulses. In FIG. 6, a case in which a batch of fine pulses includes eight fine pulses is illustrated. The number of fine pulses included in one batch of fine pulses may be adjusted according to the number of buffers of the input pulse delay unit 110 and the number of the fine pulse output units 120 as described above.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for providing a fine pulse by an all-digital pulse generator, the method comprising:
   generating a plurality of pulses delayed at predetermined time intervals;
   generating reverse pulses respectively corresponding to a plurality of pulses; and
   generating a plurality of fine pulses using the reverse pulses,
   wherein the generating of a plurality of reverse pulses comprises:

dividing one of the plurality of pulses into first and second pulses and inputting the first and second pulses having different phases and different delay times to a logic gate; and generating a reverse pulse corresponding to the one pulse using a first delay pulse with respect to the first pulse and a second delay pulse with respect to the second pulse in the logic gate.

2. The method of claim 1, wherein after passing through 2k inverters (k=1, 2, . . . , n), the first pulse is changed to the first delay pulse, after passing through 2k−1 inverters (k=1, 2, . . . , n), the second pulse is changed to the second delay pulse, and the first delay pulse and the second delay pulse are input to a not-AND (NAND) gate, respectively.

3. The method of claim 1, wherein after passing through 2k inverters (k=1, 2, . . . , n), the first pulse is changed to the first delay pulse, after passing through 2k−1 inverters (k=1, 2, . . . , n), the second pulse is changed to the second delay pulse, and the first delay pulse and the second delay pulse are input to an OR gate, respectively.

4. The method of claim 1, wherein a reverse duration of the revere pulse is equal to a difference between a delay time of the first delay pulse and a delay time of the second delay pulse.

5. The method of claim 1, wherein
the generating of a plurality of fine pulses comprises
generating fine pulses using a difference in reverse time between a first reverse pulse corresponding to one pulse and a second reverse pulse corresponding to a pulse adjacent to the one pulse.

6. The method of claim 5, wherein the difference in reverse time between the first reverse pulse and the second reverse pulse is equal to a difference in delay time between the one pulse and the adjacent pulse, and a pulse duration of a fine pulse is equal to the difference in reverse time.

7. The method of claim 1, further comprising
combining fine pulses to generate a batch of fine pulses.

8. An all-digital pulse generator for generating a fine pulse, the all-digital pulse generator comprising:
an input pulse delay unit configured to generate a plurality of pulses delayed at predetermined time intervals; and
a fine pulse output unit configured to generate reverse pulses respectively corresponding to a plurality of pulses to generate a plurality of fine pulses,
wherein the fine pulse output unit comprises a reverse pulse generating unit dividing one of the plurality of pulses into first and second pulses, generating a first delay pulse and a second delay pulse having different phases and different delay times, and inputting the first delay pulse and the second delay pulse to a logic gate to generate a reverse pulse corresponding to the one pulse.

9. The all-digital pulse generator of claim 8, wherein
the reverse pulse generating unit comprises:
a first delay unit including 2k inverters (k=1, 2, . . . , n) configured to receive a first pulse and output a first delay pulse;
a second delay unit including 2k−1 inverters (k=1, 2, . . . , n) configured to receive a second pulse and output a second delay pulse; and
a not-AND (NAND) gate or an OR gate configured to receive the first delay pulse and the second delay pulse and generate a reverse pulse corresponding to one pulse.

10. The all-digital pulse generator of claim 8, wherein the fine pulse output unit generates a fine pulse using a difference in reverse time between a first reverse pulse corresponding to one pulse and a second reverse pulse corresponding to a pulse adjacent to the one pulse.

11. The all-digital pulse generator of claim 8, wherein the difference in reverse time between the first reverse pulse and the second reverse pulse is equal to a difference in delay time between the first pulse and the second pulse, and a pulse duration of the fine pulses is equal to the difference in reverse time.

12. The all-digital pulse generator of claim 8, further comprising
a pulse synthesizing unit configured to combine fine pulses to generate a batch of fine pulses.

13. The all-digital pulse generator of claim 8, further comprising
an additional selecting unit configured to further add a fine pulse to the batch of fine pulses.

* * * * *